United States Patent [19]

Vogt et al.

[11] 4,208,654
[45] Jun. 17, 1980

[54] REMOTE CONTROL TRANSMITTER

[75] Inventors: Alfred Vogt, Salz; Bernd Veith, Bad Neustadt; Anton Rüttiger, Oberbach, all of Fed. Rep. of Germany

[73] Assignee: Preh, Electrofeinmechanische Werke, Jakob Preh Nachf GmbH & Co., Salz, Fed. Rep. of Germany

[21] Appl. No.: 934,618

[22] Filed: Aug. 17, 1978

[30] Foreign Application Priority Data

Aug. 24, 1977 [DE] Fed. Rep. of Germany ....... 2738158

[51] Int. Cl.$^2$ ............................................. H04Q 9/14
[52] U.S. Cl. ..................................... 340/351; 367/137
[58] Field of Search ............................ 325/37, 55, 64; 340/171 A, 171 R, 171 PF, 167 R, 164 R; 343/225; 178/66 R

[56] References Cited

U.S. PATENT DOCUMENTS

| | | | |
|---|---|---|---|
| 3,403,381 | 9/1968 | Hamer | 340/171 R |
| 3,472,965 | 10/1969 | Blossom | 340/171 R |
| 3,495,219 | 2/1970 | Clapp et al. | 340/171 R |
| 4,010,447 | 3/1977 | Podowski | 340/171 R |

FOREIGN PATENT DOCUMENTS 2160843  12/1971  Fed. Rep. of Germany ........... 455/352
2429066   1/1976  Fed. Rep. of Germany ........... 455/352

Primary Examiner—Robert L. Griffin
Assistant Examiner—Peter Durigon
Attorney, Agent, or Firm—Thomas E. Beall, Jr.

[57] ABSTRACT

A remote control transmitter for transmitting remote control signals which comprise an alternating sequence of two chronologically successive pulses having a first and a second frequency, respectively. The transmitter comprises a plurality of manually-operable command keys for supplying a command signal upon operation, an encoding circuit for supplying the command signal in logic form, a pulse generator having outputs which are the logic inverse of one another, a transmitting circuit for transmitting a signal dependent upon the logic signal supplied at its inputs, and a matrix of coupling points. Each coupling point is connected by a resistance element to a respective encoding circuit output, by a diode of predetermined polarity to a pulse generator output, and to a respective transmitting circuit input. The polarity of the diodes is such that during a first portion of the pulse generator period a predetermined logic command signal is supplied to the transmitting circuit, while during a second portion of the period the manually-selected command signal is supplied thereto.

11 Claims, 2 Drawing Figures

REMOTE CONTROL TRANSMITTER

BACKGROUND OF THE INVENTION

1. Field of the Invention

The invention relates to a remote control transmitter.

2. The Prior Art

Wireless remote control devices have long been used for remote control of movable objects such as cranes, locomotives, model airplanes, and toy cars. Such devices are also used with apparatus of the entertainment industry, especially apparatus with increased operating comfort, the different continuously variable adjustments such as sound intensity, contrast, color intensity, and brightness, and the adjustments variable in discrete steps such as the sender finder and the station selector, being changed through wireless remote control.

An ultrasonic signal is emitted from a transmitter which is changed in a receiver part into a corresponding control signal of the chosen frequency. Besides ultrasonic signals, infrared signals are also used for distant control. Different methods for the use of ultrasonic are already known.

The most simple method is that for each adjustment a special channel is assigned a frequency for characterizing the type of adjustment to be made. With continuously variable adjustments, two frequencies are usually necessary for the change of adjustment, one frequency for increasing and one for decreasing the adjustment. The amount of the desired change is fixed by different lengths of time of pushing of an input key. On the receiver side, for identification of the different frequencies, a number of resonant circuits corresponding to the number of frequencies is used, which makes necessary a time wasting calibration procedure before putting the receiver into service. In modern remote control systems which use integrated circuit networks, the arriving ultrasonic frequencies are converted into pulses, their repetition frequency being equal to the ultrasonic frequency. The pulses arriving within a determined time are counted in a counter and evaluated. Another known method is the Pulse-Code-Method. A coded pulse sequence is emitted by the transmitter and decoded in the receiver. This principle has the disadvantage that both the transmitter and the receiver are costly. Another disadvantage is the unsatisfactory freedom from interference, so misfunctions can occur especially at the maximum distance range or with weakened transmitting batteries.

With the use of ultrasonic signals there is the disadvantage that interferences in the transmitting path can occur, so the received ultrasonic oscillations do not correspond with the transmitted oscillations and so false operations are triggered. These interferences can result, for example, when the transmitted ultrasonic oscillation superpose with and are extinguished by ultrasonic oscillations reflecting in space.

Further, the ultrasonic-wave components of extraneous noises, such as key rattling, ringing of a telephone, or the sweep radiations of the horizontal line scan of a television receiver, or other interference sources such as ultrasonic washing plants or the simultaneous operation of several ultrasonic remote controllers, can produce a false operation. Expensive circuits and transmitting methods have been developed to prevent these false operations. A transmitting method is already known in which the elimination of interference is striven for with the use of two pulse-like reversible remote control signals. In this method, a first frequency is transmitted during the duration of pulse, as the desired frequency and, during the spacing pulses, a second frequency is transmitted as auxiliary frequency. The auxiliary frequency is transmitted until the receiver is not ready any more to receive or the amplitude of the auxiliary frequency transmitted is decreased so slowly that no more oscillations are produced which contain the desired frequency. The auxiliary frequency of the transmission oscillator is produced by a resonant circuit formed by a coil and a capacitor. Further, a pulse generator producing a pulse sequence is present which switches the auxiliary frequency on or off by means of an electronic switch. From this follows that the transmission oscillator oscillates during the duration of pulse with the desired frequency instead of with the auxiliary frequency. The number of pulses which are produced by the pulse generator depends upon which one of the keys connected with the pulse generator are operated. In this transmitting method it is disadvantageous that no further operating channel can lie between auxiliary and desired frequencies because the oscillation frequency at the frequency reversal covers the complete band lying between the auxiliary frequency and the desired frequency. Further, ultrasonic remote control with pulse modulation is known for televisions in which the ultrasonic signal consists of two chronological frequencies which are coded in their value in their respective duration. The frequency of the first ultrasonic tone determines the kind of information, such as whether a channel is chosen or a gain shall be changed, while the duration of the first ultrasonic tone fixes the channel number or, for example, the kind and direction of the gain change. Only the second ultrasonic tone releases the execution of the order stored previously. Its duration controls in digital steps the size of the gain change. The ultrasonic signal is amplified, limited, and filtered in the receiver and then changed into direct current signals. Through the ultrasonic signal, multivibrators are switched on or off which give up, during their duration of connection, pulses of exactly defined duration. These pulses are evaluated in decadic forward- and backward ring counters. Additional circuits are arranged at its outputs which pass on the digital orders directly or changed into analogue values to the stages to be controlled. It is disadvantageous with this remote control that the resonance effects make impossible an exact evaluation of the transmitted frequency packages. The circuit of the ultrasonic transmitter is still constructed of discrete electronic components.

Further, an ultrasonic transmitter is known which is constructed with a highly integrated circuit network which consists of an input keyboard, an integrated input code circuit, a resistance network, a matrix with coupling points, an integrated transmitter unit, and a pulse generator for producing an alternating chronological sequence of two pulses of a first and a second frequency, respectively. In order to enable transmission of several commands, altogether three integrated input coding circuits are switched in parallel respectively on five outputs. One of the input coding circuits serves for the production of a field first frequency, also called group frequency. This first frequency is produced independently of which key of the input keyboard is operated, and which variable second frequency, also called command frequency, is thereby produced. If one defines the gains as L and H, with parallel output circuits, the outputs which command level L are privileged. This means, that this circuit can give one clear first frequency as group frequency and this is the one which shows only L on the five outputs. This is disadvantageous if several frequencies are necessary, which is the case, for example, if plural receivers independent of each other shall be operated at the same time. This problem can be solved if each receiver is assigned its own group frequency. This is not possible with the known circuit.

SUMMARY OF THE INVENTION

Therefore, it is an object of the invention to avoid these disadvantages for a different control transmitter of the previously mentioned kind and to find a simple, easily exchangeable circuit which allows, especially in connection with highly integrated switching networks, a random selection of the fixed frequency or group frequency from a number of available frequencies.

This problem is solved according to the invention in that the outputs of the pulse generator are connected via diodes with the coupling points of a matrix, wherein the correlation of the outputs of the diodes, the polarity of the diodes and the connection to the coupling points of the matrix are chosen such that one of the two pulses has assigned a fixed, freely selectable frequency, independent of which other frequency is transmitted by operation of the input keyboard.

BRIEF DESCRIPTION OF THE DRAWINGS

A detailed description of the preferred embodiment follows below with reference to the drawings, in which.

THE PREFERRED EMBODIMENT

Figure 1:
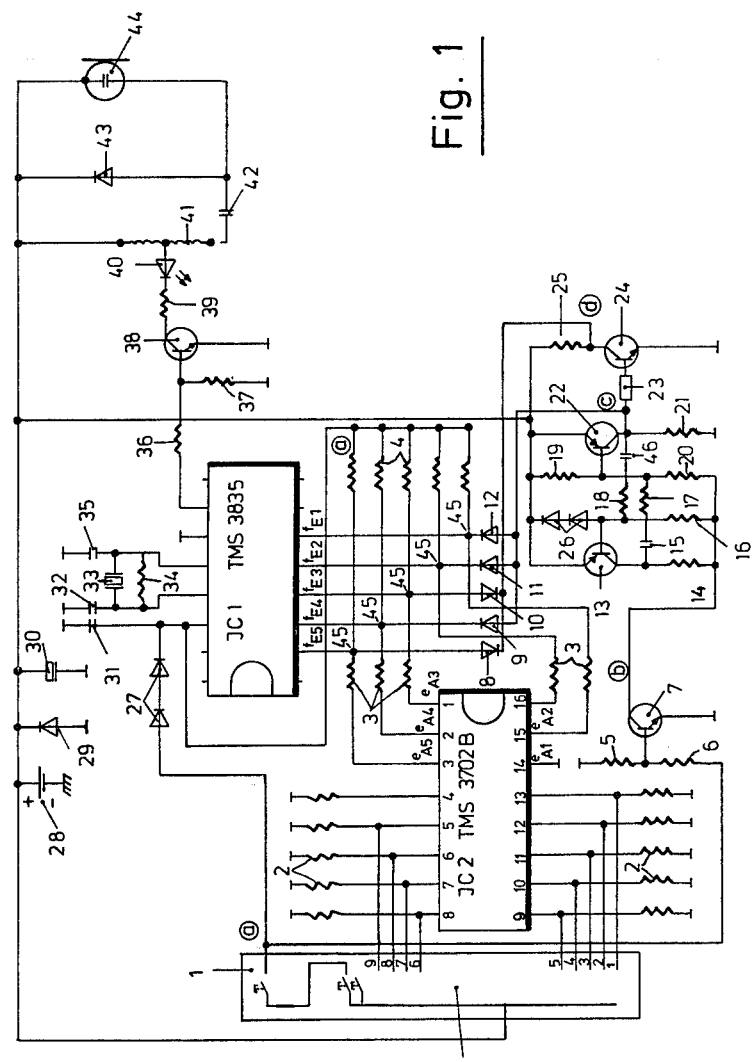
FIG. 1 shows a circuit diagram of a remote control signal transmitter.

The circuit diagram of a transmitter shown in FIG. 1 shows essentially an input keyboard 1 having a plurality of manually operable keys, and integrated encoding circuit IC2, an integrated transmitter unit IC1 having an output stage, and a pulse generator circuit. The input keyboard 1 has a row of keys, the number of which corresponds to the number of desired commands. In this embodiment 9 commands are provided in all. The keys may be short-stroke keys or contact keys, as desired. Each key has two simultaneously operable contacts. One contact of each key has a common pole coupled to the supply voltage 28, and a pole is connected with a respective input of the encoder circuit IC2. The other contact of each key has one pole also connected with the supply voltage and the other pole connected in series with an activation ON-key. Only upon simultaneous operation of the ON-key and of a command key the transmitter will start to work. In the circuit diagram of FIG. 1, only one command key (for input No. 9) is drawn as an example. The remaining command keys are developed correspondingly.

As integrated encoding network TMS 3702 is preferred as encoding circuit. The inputs thereof are connected to ground by resistors 2. Because this encoding network can process 10 commands, yet, in the illustrated embodiment only 9 commands are needed, input No. 4 is not connected with a key contact pole. It is instead coupled only to ground by one of the resistors 2.

The encoding network IC2 is constructed in C-MOS-technology and with it 10 commands are coded on 5 bit code at the outputs.

The formal logic table looks as follows:

| Input Pin No. | Command No. | Output Pin No. | | | | |
|---|---|---|---|---|---|---|
| | | 15 | 16 | 1 | 2 | 3 |
| — | — | H | H | H | H | H |
| 13 | 11 | L | L | H | L | L |
| 12 | 12 | L | L | L | L | L |
| 11 | 13 | H | L | L | L | L |
| 10 | 14 | H | H | L | L | L |
| 9 | 15 | H | H | H | H | L |
| 8 | 16 | L | H | H | H | L |
| 7 | 17 | L | L | H | H | L |
| 6 | 18 | L | L | L | H | L |
| 5 | 19 | H | L | L | H | L |
| 4 | 20 | H | H | L | H | L |

Upon simultaneous operation of a plurality of inputs, the level L at the output is privileged.

The outputs of encoding network IC2 are coupled by resistors 3 to the coupling points of a matrix which points in turn are coupled to the inputs of a transmitting unit IC1. An integrated network TMS 3835 is preferred as transmitting circuit. The transmitting network IC1 is a programmable frequency generator in C-MOS-technology. Up to 20 different frequencies, which are derived from a crystal-controlled frequency, can be produced by the external programming already described. An internal oscillator produces a frequency of 2.975120 MHz, which is divided down through a sevenstep Johnson counter. As external oscillator circuit, only the quartz crystal 33 and a passive feedback network consisting of the two capacitors 32 and 35 and the resistor 34 for working point adjustment of the oscillator are needed. The coding for the switching network IC1 is given in the following table:

| Command | Bit | | | | | Command | Bit | | | | |
|---|---|---|---|---|---|---|---|---|---|---|---|
| | 1 | 2 | 3 | 4 | 5 | | 1 | 2 | 3 | 4 | 5 |
| 1 | H | L | L | H | H | 11 | L | L | H | L | L |
| 2 | H | H | L | H | H | 12 | L | L | L | L | L |
| 3 | H | H | H | L | H | 13 | H | L | L | L | L |
| 4 | L | H | H | L | H | 14 | H | H | L | L | L |
| 5 | L | L | H | L | H | 15 | H | H | H | H | L |
| 6 | L | L | L | L | H | 16 | L | H | H | H | L |
| 7 | H | L | L | L | H | 17 | L | L | H | H | L |
| 8 | H | H | L | L | H | 18 | L | L | L | H | L |
| 9 | H | H | H | L | L | 19 | H | L | L | H | L |
| 10 | L | H | H | L | L | 20 | H | H | L | H | L |

For production of an alternating sequence of two chronologically successive pulses of a first and a second frequency, respectively, a pulse generator is needed. The first frequency in this embodiment is chosen as group frequency, although the opposite choice is also possible. The pulse generator consists of an astable multivibrator which is switched on by an electronic switch, and an inverting stage. Upon simultaneous operation of a command key and the ON-key, supply voltage is lead over a resistor 6 to the base of a transistor 7 of the electronic circuit. The base is connected to ground by a resistor 5. If the transistor 7 is driven by a positive base voltage, then the multivibrator is switched to ground and the multivibrator starts to oscillate. This electronic switch (transistor 7) serves here as an inverting stage, since supply voltage is provided from the input keyboard, but ground is needed at the multivibrator.

The astable multivibrator consists, in a known manner, of two transistors 13 and 22, the base of each being coupled with the collector of the other by a resistor 17 and a capacitor 15, or a resistor 18 and a capacitor 46, respectively. The base of each transistor is coupled to ground by a highly resistive resistor 16 or 20, respectively. Each collector is also coupled to ground by a resistor 14 or 21, respectively. In addition, the base of transistor 22 is coupled to supply voltage by a resistor 19. The base of transistor 13 is coupled with supply voltage by two series-connected diodes 26. If these were replaced by a resistor, the first half of the pulse sequence produced by the multivibrator (which corresponds in this example to the group frequency) would be extended during switching-on of the multivibrator through charging of the condensators to their operating values. To shorten this half, and therefore to make possible a defined switching-on of the group frequency, these two diodes are provided. Because the operation of an astable multivibrator is generally known, the function shall not be described here in detail.

The multivibrator has coupled to its output an inverting stage. This comprises a transistor 24, the base of which is coupled by a resistor 23 to the output c of the multivibrator. The emitter of the transistor lies at ground potential and the collector receives supply voltage over a resistor 25. The output c of the multivibrator and the output d of the reversal stage are connected by diodes 8–12 with respective coupling points 45 of the matrix. The function of the diodes is explained below in detail with reference to the pulse diagram of FIG. 2. Coupling points 45 are further coupled by resistors 4 to a reduced supply voltage through two series-connected diodes 27. These diodes were interposed because the switching network IC1 requires a lower supply voltage than the voltage delivered from the battery 28. Because an L-signal appearing at the inputs $f_{E1}$–$f_{E5}$ of the switching network IC1 will only be recognized if it lies under a threshold value (which is approximately one-tenth of the supply voltage), the resistors 4 must be of relatively higher resistance than the resistors 3. Transmitting network IC1 is protected against a reversed battery voltage by a polarity protection diode 29. Capacitors 30 and 31 act as filter condensors.

The output signal of the switching network IC1 is supplied to a transmitter coil 41 by an amplifier stage. The amplifier stage consists of a transistor 38, the emitter of which is coupled to ground. The base is connected by a resistor 37 to ground as well as by resistor 36 to the output of the switching network IC1. The collector is coupled to the transmitter member 41 by a resistor 39 and a light-emitting diode 40 which indicates the ON-state of the transmitter. Transmitter coil 41 serves to produce the voltage required by the transmitter element 44. Diode 43 serves as a rectifier diode for the polarization of the voltage. Because the pulses delivered from the amplifier are rectangularly shaped, the circuit formed of the transmitter coil 41, the capacitor 42 and the transmitter element 44 contribute to the smoothing to eliminate undesired harmonics.

In this example, a condensor transmitter for ultrasonic waves has been used as transmitter element 44. It would also be possible to use another suitable type of transmission waves, such as electromagnetic waves.

Figure 2:
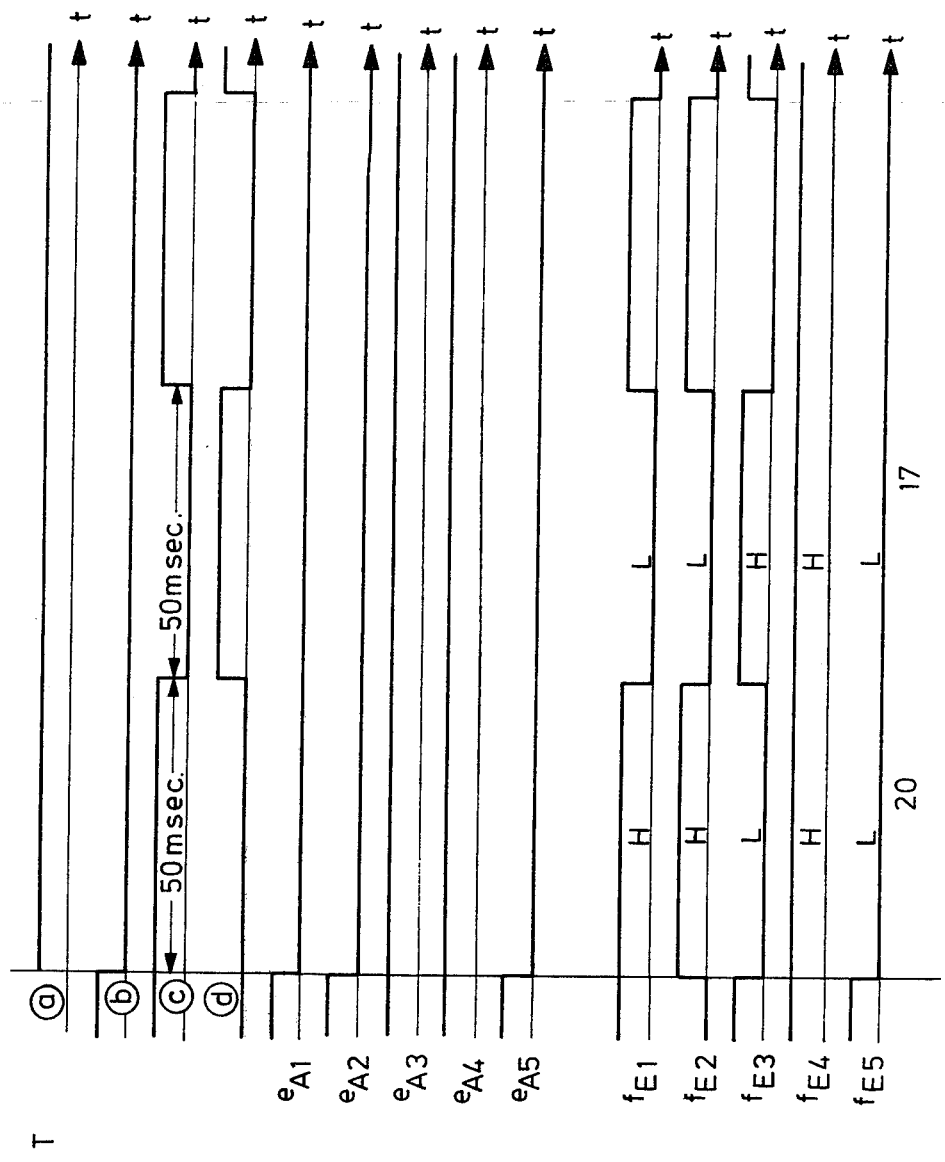
FIG. 2 shows a pulse diagram of the transmitter of FIG. 1.

An example of the functioning of the transmitter will now be described in detail with the aid of the pulse diagram of FIG. 2.

The highest available frequency has been designated as group frequency in this example. This corresponds to command No. 20 of IC2. Accordingly, the command is as follows: H H L H L. As command frequency corresponding to command No. 17 (L L H H L) has been chosen for this operation example.

If now the key corresponding to command No. 17 of the input keyboard (key No. 7) and the ON-key are pushed simultaneously, the transmitter sends out a pulse sequence which consists of an alternating sequence of two chronologically successive pulses of respective first and second frequencies. This means, that the first pulse contains the group frequency (command No. 20) and the second pulse contains the command frequency (command No. 17). The group frequency is fixed beforehand for each transmitter by appropriate selection of the polarities of diodes 8 to 12. If two transmitters should be operated simultaneously, they must have different group frequencies for differentiation of the different receivers. The portion of the circuit containing diodes 8–12 must in this respect be easily exchangeable.

When the command key No. 7 and the ON-key are simultaneously pushed, signal a (FIG. 2) appears at the output of the keyboard. Signal b is the inverse of signal a. At the output of the pulse generator, which consists of the multivibrator and the inverting stage signals c and d appear. The pulse duration is assumed here to be 50 msec. Through operation of the command key, the coded command No. 17 L L H H L appears for the total duration of pulse at the output of encoder IC2. The signal c is positive for the first portion of pulse duration (pulse period). Thus, the diodes 9, 11 and 12 become conductive so that the inputs $f_{E1}$, $f_{E2}$ and $f_{E4}$ receive positive voltage. The signal d is negative for the first portion of pulse duration. Thus, diodes 8 and 10 also become conductive so that the inputs $f_{E3}$ and $f_{E5}$ receive negative voltage. The group frequency No. 20 (H H L H L) therefore appears at the input of the switching network IC1 independent of which command frequency has been chosen. During the second pulse duration the diodes are blocked so that the command frequency operates. Through the correlation of the outputs of the pulse generator, the selection of the polarity of the diodes 8–12, and the connection of the diodes to the coupling points, any desired frequency can be chosen as group frequency. Expediently, this part of the circuit can be combined on an easily changeable module or on a printed circuit board.

We claim:

1. Apparatus for transmitting remote control signals having an alternating sequence of two chronologically successive frequency pulses, the first said pulse having a first, predetermined frequency and the second pulse having a second, manually-selectable frequency, the apparatus comprising:

a plurality of manually operable command keys, each key supplying at a respective output a manually-selected command signal upon operation;

circuit means having a respective input coupled to each said key output for encoding and supplying on a plurality of outputs the received, manually-selected command signal in logic form;

circuit means for generating and supplying at resepective outputs two periodic logic pulse sequences which are the logical inverse of one another;

circuit means having a plurality of logic inputs for transmitting a signal having a frequency dependent on the logic signals supplied to said inputs;

a plurality of resistance elements;

a plurality of diodes; and a matrix of coupling points, each said coupling point being connected by a respective resistance element to a respective encoding circuit means output, by a respective diode of predetermined polarity to one of said pulse generating circuit means outputs, and to a respective input of said transmitting circuit means, the polarity of said diodes being predetermined such that during a first portion of the period of said generating circuit means said diodes are conductive to permit a predetermined logic command signal to be supplied from said generating circuit means outputs through said coupling points to said transmitting circuit means and such that during a second portion of said period said diodes are nonconductive to permit said encoded, manually-selected command signal to be passed through said resistors and said coupling points to said transmitting circuit means.

2. The apparatus of claim 1 wherein said transmitting circuit means comprises an integrated transmitter circuit and a transmitter output stage.

3. The apparatus of claim 1 wherein said encoding circuit means comprises an integrated encoding circuit.

4. The apparatus of claim 1 wherein said pulse-sequence generating circuit means comprises an astable multivibrator and an inverting stage coupled to the output of said astable multivibrator.

5. The apparatus of claim 4, further comprising a manually-operable activation key coupled to provide a signal for switching on said astable multivibrator when both said activation key and one of said command keys are operated.

6. The apparatus of claim 5 wherein each said command key comprises two simultaneously operable switch contacts, one said switch contact being connected in series between a supply voltage and a respective said encoding circuit means input and the other said switch contact being connected in series between said supply voltage and said activation key.

7. The apparatus of claim 1, further comprising a plurality of additional resistance elements and a manually-operable activation key, each of said additional resistance elements being coupled between a respective said matrix coupling point and the output terminal of said activation key.

8. The apparatus of claim 7 wherein the resistance values of said additional resistance elements are higher than the resistance values of said first-mentioned plurality of resistance elements.

9. The apparatus of claim 8 wherein each said command key comprises two simultaneously operable switch contacts, one said switch contact being connected in series between a supply voltage and a respective said encoding circuit means input and the other said switch contact being connected in series between said supply voltage and said activation key.

10. The apparatus of claim 1 wherein said diodes are mounted on a readily exchangeable modular unit, whereby said first, predetermined frequency is predetermined by selecting a said modular unit having said diodes arranged thereon with polarities corresponding to said predetermined command signal.

11. The apparatus of claim 1 wherein said diodes are mounted on a readily exchangeable circuit board, whereby said first, predetermined frequency is predetermined by selecting a said circuit board having said diodes arranged thereon with polarities corresponding to said predetermined command signal.

* * * * *